(12) United States Patent
Huang

(10) Patent No.: US 7,326,635 B2
(45) Date of Patent: Feb. 5, 2008

(54) METHOD AND APPARATUS FOR STRIPPING PHOTO-RESIST

(75) Inventor: Chih-Hung Huang, Miao-Li (TW)

(73) Assignee: Innolux Display Corp., Chu-Nan, Miao-Li County (TW)

( * ) Notice: Subject to any disclaimer, the term of this patent is extended or adjusted under 35 U.S.C. 154(b) by 362 days.

(21) Appl. No.: 11/028,102

(22) Filed: Dec. 31, 2004

(65) Prior Publication Data

US 2006/0003593 A1 Jan. 5, 2006

(30) Foreign Application Priority Data

Jun. 30, 2004 (TW) .............................. 93119340 A

(51) Int. Cl.
*H01L 21/44* (2006.01)

(52) U.S. Cl. .................. 438/612; 438/689; 438/99; 438/725; 438/758; 257/E21.001; 257/E39.007; 257/E51.001

(58) Field of Classification Search ................ 438/612, 438/689; 430/256; 422/66
See application file for complete search history.

(56) References Cited

U.S. PATENT DOCUMENTS

| | | | | |
|---|---|---|---|---|
| 4,617,251 A | * | 10/1986 | Sizensky | 430/256 |
| 5,597,678 A | * | 1/1997 | Honda et al. | 430/331 |
| 5,717,063 A | * | 2/1998 | Scherkenbeck et al. | 530/323 |
| 5,989,757 A | * | 11/1999 | Satoi | 430/7 |
| 6,156,484 A | * | 12/2000 | Bassous et al. | 430/313 |
| 6,471,039 B1 | * | 10/2002 | Bruun et al. | 198/577 |
| 6,946,410 B2 | * | 9/2005 | French et al. | 438/800 |
| 7,156,927 B2 | * | 1/2007 | Christenson et al. | 134/27 |
| 2002/0041829 A1 | * | 4/2002 | Kowallis | 422/66 |
| 2003/0037431 A1 | * | 2/2003 | Benson et al. | 29/623.1 |
| 2004/0241996 A1 | * | 12/2004 | Hung et al. | 438/689 |
| 2006/0246690 A1 | * | 11/2006 | Dordi et al. | 438/478 |

FOREIGN PATENT DOCUMENTS

TW 490072 6/2002

* cited by examiner

*Primary Examiner*—Michael Lebentritt
*Assistant Examiner*—Abdulfattah Mustapha
(74) *Attorney, Agent, or Firm*—Wei Te Chung

(57) ABSTRACT

A method for stripping a photo-resist includes the steps of: (a) wet stripping a photo-resist off from a substrate; and (b) rinsing the substrate under high-speed conveyance using an aqua knife. A speed of the conveyance of the substrate is 0.2 m/s or higher. Because the aqua knife can rinse the stripping solvent and the reaction product in the stripping step remained on the substrate that can erode an aluminum film below the photo-resist, aluminum erosion is significantly reduced. In addition, the substrate is conveyed in a high speed, such that the rinsing step is transient. Therefore, the aluminum erosion issued in the rinsing step is little. Moreover, there is no need for an isopropyl alcohol rinsing step or a carbon dioxide rinsing step. Thus, the method has increased yield and reduced cost. A related apparatus is also provided.

14 Claims, 3 Drawing Sheets

METHOD AND APPARATUS FOR STRIPPING PHOTO-RESIST

BACKGROUND OF THE INVENTION

1. Field of the Invention

This invention relates to semiconductor fabrication methods and apparatuses, and particularly to a method and an apparatus for stripping a photo-resist without causing damage to metal wirings of a substrate.

2. Description of the Prior Art

When an integrated circuit is fabricated on a semiconductor wafer, a polysilicon layer and a metal layer are patterned into conductive layers, and a contact hole and a via-hole are formed in insulating layers. Such small-scale patterning is usually achieved by using a lithography step. Photo-resist solution is first spread over the conductive/insulating layer, so that the conductive/insulating layer is covered by a photo-resist layer. A pattern image is optically transferred from a photo-mask to the photo-resist layer, thereby forming a latent image in the photo-resist layer. The latent image is then developed. Using the residual photo-resist as a mask, the conductive/insulating layer is patterned by way of a wet etching or a dry etching process. The photo-resist mask exposes a part of the conductive/insulating layer to etchant, and the etchant removes the part of the conductive/insulating layer. Upon completion of the wet/dry etching process, the residual photo-resist is stripped off.

Conventional methods for stripping the photo-resist include a dry stripping method and a wet stripping method.

The technology of the dry stripping method is called "ashing." The photo-resist is exposed to oxygen plasma, so that the oxygen plasma ashes the photo-resist. However, the oxygen plasma is not effective against any reaction product that may exist. The reaction product remains on the inner surface of an inter-level insulating layer in particular. For this reason, ashing is not appropriate in a case where a reaction product is expected.

In the wet stripping method, various organic or inorganic solvents can be used to dissolve the photo-resist. The organic solvent can be acetone, n-methyl pyrrolidone (NMP), dimethyl sulfoxide (DMSO), or aminoethoxy ethanol. The inorganic solvent can contain sulfuric acid and hydrogen peroxide. The wet stripping method is less costly than the dry stripping method. However, the solvent and any reaction products that exist erode metal (aluminum) wires below the photo-resist after the photo-resist has been stripped off.

Referring to FIG. 3, a conventional wet stripping method for stripping a photo-resist includes the steps of: (a) wet cleaning a substrate using a wet stripping solvent; (b) rinsing the substrate using isopropyl alcohol (IPA); and (c) rinsing and neutralizing the substrate using a carbon dioxide ($CO_2$) solution.

In step (a), a stripping solvent consisting of monoethanol amine and dimethyl sulfoxide (($CH_3)_2SO$) is spread onto the substrate. After the photo-resist is stripped off, the solution operates to effect chemical change, as shown in the following chemical equation:

$$C_2H_5O-NH_2+3H_2O \rightarrow C_2H_5OH+NH_4^+ +3OH^-$$

Ammonia ($NH_4OH$), a reaction product of the above chemical equation, intensively erodes the aluminum wires, as shown in the following chemical equation:

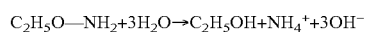

A speed of the erosion is approximately $(0.167\sim1.67)\times10^{-10}$ m/s.

Accordingly, step (b) is performed to reduce or eliminate the aluminum erosion occurring in step (a). However, in practice, the isopropyl alcohol cannot effectively neutralize monoethanol amine, dimethyl sulfoxide or ammonia. The erosion of aluminum is not prevented.

Step (c) is an adjunct to the process of step (b). $CO_2$ solution is used to neutralize the solution eroding the aluminum wires, as shown in the following chemical equation:

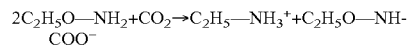

above-described wet stripping method. The yield of the wet etching process is decreased accordingly. In addition, the need for the IPA rinsing step (b) and the $CO_2$ solution rinsing step (b) necessarily adds to costs.

Referring FIG. 4, this represents a conventional apparatus for stripping a photo-resist as disclosed in Taiwan patent no. 490,072. The apparatus 10 includes a stripping vessel 20 filled with a stripping solvent, a rinsing vessel 30 filled with a rinsing solution, a drying device 40, a plurality of conveyors 50 mounted between the stripping vessel 20 and the rinsing vessel 30, and a control unit 60 for controlling the conveyors 50. However, the stripping solvent used to clean the substrate in the stripping vessel 20 consists of monoethanol amine and dimethyl sulfoxide. Thus the above-described aluminum erosion problem still occurs.

It is desired to provide a new method and apparatus for stripping a photo-resist that overcomes the above-described problems.

SUMMARY OF THE INVENTION

Accordingly, an objective of the present invention is to provide a method for stripping a photo-resist which does not cause damage to a metal wiring of a substrate.

Another objective of the present invention is to provide an apparatus for stripping a photo-resist which does not cause damage to a metal wiring of a substrate.

In order to achieve the first above-mentioned objective, a method of the present invention for stripping a photo-resist comprises the following steps: (a) wet stripping a photo-resist off from a substrate; and (b) rinsing the substrate under high-speed conveyance using an aqua knife. A speed of the conveyance of the substrate is 0.2 m/s or higher.

In order to achieve the second above-mentioned objective, an apparatus of the present invention for stripping a photo-resist comprises a stripping vessel filled with a stripping solvent, a rinsing vessel having an aqua knife device, a plurality of conveyors mounted between the stripping vessel and the rinsing vessel, and a control unit for controlling the conveyors.

Because the aqua knife can rinse the stripping solvent and the reaction product in the stripping step remained on the substrate that can erode an aluminum film below the photo-resist, aluminum erosion is significantly reduced. In addition, the substrate is conveyed in a high speed, such that the rinsing step is transient. Therefore, the aluminum erosion issued in the rinsing step is little. Moreover, unlike in the prior art, there is no need for an IPA rinsing step and a $CO_2$ solution rinsing step. Thus, the method has increased yield and reduced cost.

Other objects, advantages and novel features of the present invention will be apparent from the following detailed description of preferred embodiments thereof with reference to the attached drawings, in which:

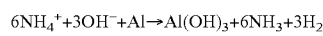

DETAILED DESCRIPTION OF THE INVENTION

Figure 1:
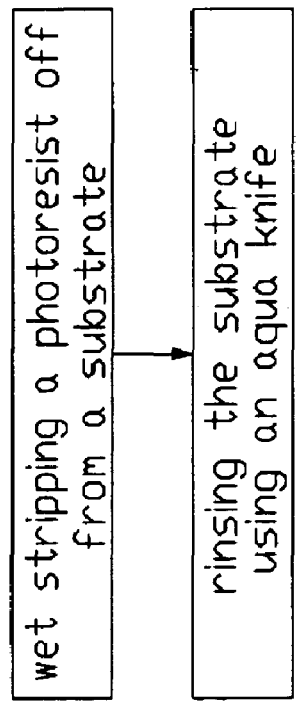
FIG. 1 is a flow chart of a method for stripping a photo-resist according to the present invention.

As shown in FIG. 1, a method for stripping a photo-resist in accordance with the present invention includes two steps: wet stripping a photo-resist off from a substrate, and rinsing the substrate using an aqua knife.

In the first step, a substrate having a photo-resist is provided. A stripping solvent is spin-coated onto the substrate. The spin-coating method comprises dispensing drops of the stripping solvent onto the substrate, and then spinning the substrate in order that the stripping solvent is distributed uniformly on the substrate. Alternatively, a spray-coating method can be used instead of the spin-coating method. The spray-coating method comprises spraying the stripping solvent uniformly onto the substrate using a nozzle. The stripping solvent is an organic solvent, such as n-methyl pyrrolidone. Alternatively, dimethyl sulphoxide (DMSO), monoethanol amine (MEA), acetone ($C_3H_6O$) or aminoethoxy ethanol can be used as the stripping solvent instead of n-methyl pyrrolidone. The stripping solvent dissolves the photo-resist and strips it off from the substrate. However, some stripping solvent and one or more reaction products of the stripping step remain on the substrate, and these residual substances erode an aluminum film of the substrate that lies below the photo-resist.

In the second step, the substrate is conveyed at a high speed of 0.2 m/s or higher. At the same time, an aqua knife is used to rinse the substrate. A rinsing direction of the aqua knife is substantially opposite to a direction of the conveyance of the substrate. A flux of the aqua knife is $3.3 \times 10^{-4}$ $m^3/s$ or higher. Liquid used in the aqua knife is deionized water.

Because the aqua knife can rinse the residual stripping solvent and reaction products of the stripping step, aluminum erosion is significantly reduced. Moreover, the substrate is conveyed at a high speed (0.2 m/s), such that the rinsing step is very transient (approximately 2 s). Therefore, the aluminum erosion occurring in the rinsing step is minimal ($(0.33 \sim 3.3) \times 10^{-10}$ m). In addition, unlike in the prior art, there is no need for an IPA rinsing step and a $CO_2$ rinsing step. In summary, the method increases yield and reduces costs.

Figure 2:
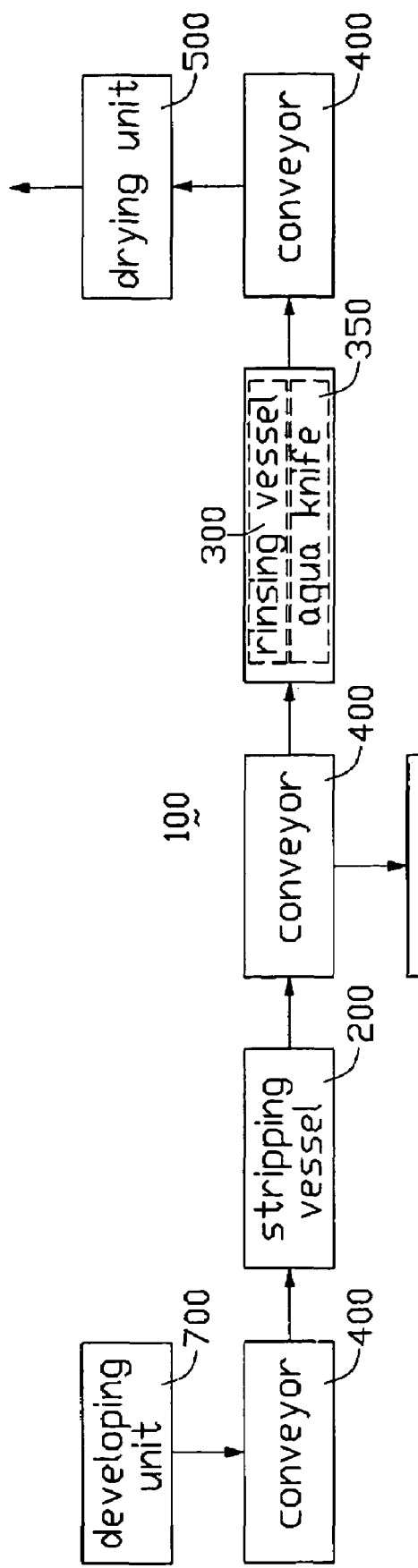
FIG. 2 is a schematic diagram of an apparatus for stripping a photo-resist according to the present invention.
Figure 3:
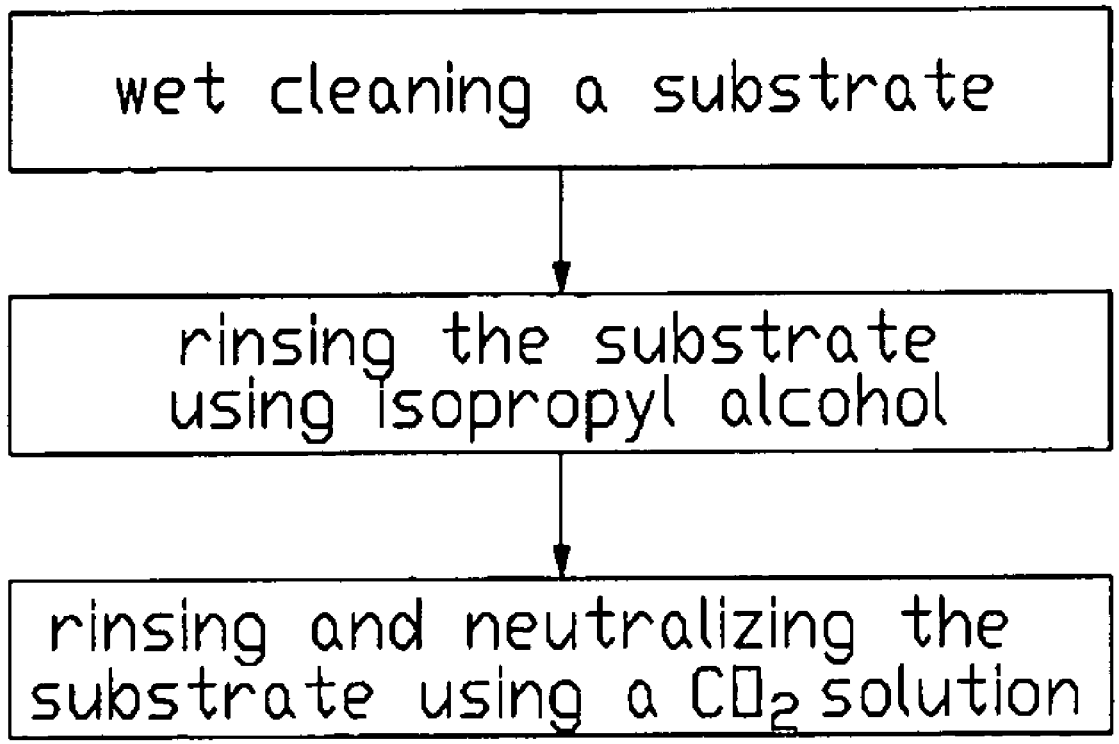
FIG. 3 is a flow chart of a conventional method for stripping a photo-resist.
Figure 4:
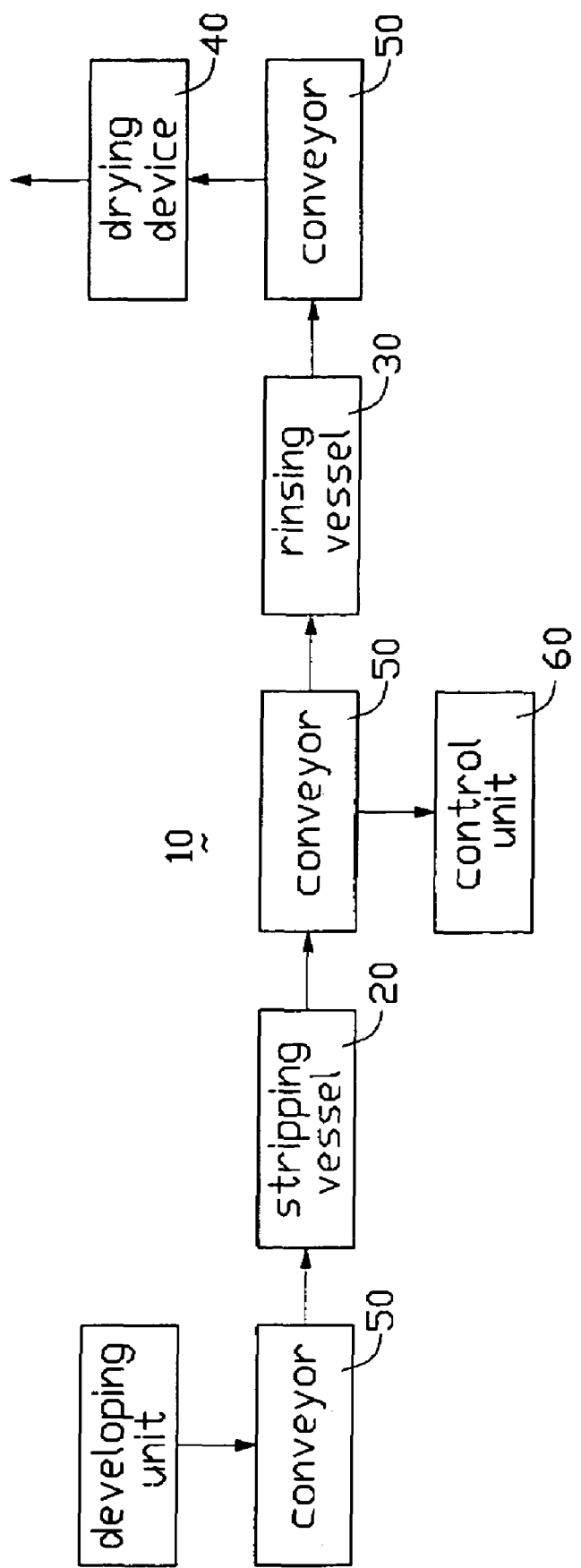
FIG. 4 is a schematic diagram of a conventional apparatus for stripping a photo-resist.

Referring to FIG. 2, an apparatus 100 for stripping a photo-resist used in the above-described method comprises a stripping vessel 200, a rinsing vessel 300, a plurality of conveyors 400, a drying unit 500, and a control unit 600. The stripping vessel 200 is filled with the stripping solvent, such as n-methyl pyrrolidone, dimethyl sulphoxide (DMSO), monoethanol amine (MEA), acetone or aminoethoxy ethanol. The rinsing vessel 300 is located behind the stripping vessel 200, and contains an aqua knife device 350. Liquid used in the aqua knife is deionized water. The conveyors 400 are mounted between the developing unit 700 and the stripping vessel 200, between the stripping vessel 200 and the rinsing vessel 300, and between the rinsing vessel 300 and the drying unit 500. The control unit 600 controls a speed of conveyance of the substrate.

In operation of the apparatus 100, substrate having a photo-resist is produced by a development process in the developing unit 700. The substrate having the photo-resist is conveyed into the stripping vessel 200 by the relevant conveyors 400, which are controlled by the control unit 600. The photo-resist is stripped off the substrate in the stripping vessel 200. Then the substrate is conveyed by the relevant conveyors 400 through the rinsing vessel 300 at a high speed. At the same time, the aqua knife 350 rinses the substrate in a direction opposite to the direction of conveyance of the substrate. Then the substrate is conveyed by the relevant conveyors 400 into the drying unit 500, and is dried in the drying unit 500. Thus, the apparatus 100 carries out a complete photo-resist stripping process.

It is to be understood that even though numerous characteristics and advantages of the present invention have been set out in the foregoing description, together with details of the steps, structure and function of the invention, the disclosure is illustrative only, and changes may be made in detail, especially in matters of arrangement of steps and shape, size and arrangement of parts within the principles of the invention to the full extent indicated by the broad general meaning of the terms in which the appended claims are expressed.

I claim:

1. A method for stripping a photo-resist, comprising the steps of:
   (a) wet stripping a photo-resist off from a substrate; and
   (b) rinsing the substrate under high-speed conveyance using an aqua knife;
   wherein a speed of the conveyance of the substrate is 0.2 m/s or higher.

2. The method for stripping a photo-resist as recited in claim 1, wherein a stripping solvent is used in step (a), and the stripping solvent is an organic solvent.

3. The method for stripping a photo-resist as recited in claim 2, wherein the organic solvent is n-methyl pyrrolidone.

4. The method for stripping a photo-resist as recited in claim 2, wherein the organic solvent is dimethyl sulphoxide.

5. The method for stripping a photo-resist as recited in claim 2, wherein the organic solvent is monoethanol amine.

6. The method for stripping a photo-resist as recited in claim 2, wherein the organic solvent is acetone.

7. The method for stripping a photo-resist as recited in claim 2, wherein the organic solvent is amninoethoxy ethanol.

8. The method for stripping a photo-resist as recited in claim 1, wherein a rinsing direction of the aqua knife is substantially opposite to a direction of the conveyance of the substrate.

9. The method fir stripping a photo-resist as recited in claim 1, wherein a flux of the aqua knife is $3.3 \times 10^{-4}$ $m^3/s$ or higher.

10. The method for stripping a photo-resist as recited in claim 1, wherein liquid used in the aqua knife is deionized water.

11. An apparatus for stripping a photo-resist, comprising:
    a stripping vessel;
    a rinsing vessel having an aqua knife device;
    at least one conveyor mounted between the stripping vessel and the rinsing vessel; and
    a control unit for controlling the conveyor.

12. The apparatus for stripping a photo-resist as recited in claim 11, further comprising a drying unit.

13. The apparatus for stripping a photo-resist as recited in claim 11, wherein liquid used in the aqua knife is deionized water.

14. A method for stripping a photo-resist, comprising the steps of:
- (a) wet stripping a photo-resist off from a substrate; and
- (b) rinsing the substrate under high-speed conveyance using an aqua knife;

wherein means for performing step (b) include:
- a rinsing vessel having an aqua knife device;
- at least one conveyor mounted between the stripping vessel and the rinsing vessel; and
- a control unit for controlling the conveyor.

* * * * *